United States Patent [19]

Slepian et al.

[11] 4,217,808

[45] Aug. 19, 1980

[54] DETERMINATION OF PITCH

[76] Inventors: David Slepian, 212 Summit Ave., Summit, N.J. 07901; Edward J. Weldon, Jr., 1152 Kealaolu Ave., Honolulu, Hi. 96816

[21] Appl. No.: 961,401

[22] Filed: Nov. 16, 1978

Related U.S. Application Data

[63] Continuation-in-part of Ser. No. 816,740, Jul. 18, 1977, abandoned.

[51] Int. Cl.[3] .......................... G10G 7/02; G01R 23/02

[52] U.S. Cl. ...................................... 84/454; 324/77 A; 324/78 D

[58] Field of Search ................. 84/454, DIG. 18, 464; 324/78 R, 78 D, 77 A; 128/2.05 T, 2.05 S, 2.05 Q, 2.05 P

[56] References Cited

U.S. PATENT DOCUMENTS 4,028,985 6/1977 Merritt ................................. 84/454
4,051,433 9/1977 Dimotakis .......................... 324/78 R

FOREIGN PATENT DOCUMENTS 1445855 8/1976 United Kingdom ...................... 84/454

*Primary Examiner*—L. T. Hix
*Assistant Examiner*—S. D. Schreyer
*Attorney, Agent, or Firm*—George E. Kersey

[57] ABSTRACT

Method and apparatus for determining pitch by establishing the fundamental period of an incoming acoustic wave and comparing this fundamental period with the period of certain standard pre-established tones. The name of the standard tone with period closest to the measured fundamental period of the incoming wave is indicated and displayed. Also displayed is an indication of the degree and direction of any deviation between the pitch of the incoming wave and that of the displayed standard tone.

17 Claims, 13 Drawing Figures

| COMPONENT AMPLITUDE | COMPONENT PHASE |
|---|---|
| FUND: $A_1 = 1$ | $\phi_1 = 0$ |
| 2ND HAR: $A_2 = .1$ | $\phi_2 = 25°$ |
| 3RD HAR: $A_3 = .3$ | $\phi_3 = 125°$ |
| 4TH HAR: $A_4 = .1$ | $\phi_4 = -15°$ |

$A_1 = .2$ $\phi_1 = 0$
$A_2 = 1$ $\phi_2 = 52°$
$A_3 = .05$ $\phi_3 = -11°$
$A_4 = .1$ $\phi_4 = 223°$ $A_1 = 1$ $\phi_1 = 0$
$A_2 = .2$ $\phi_2 = -65°$
$A_3 = .5$ $\phi_3 = 0$
$A_4 = .1$ $\phi_4 = -10°$ $A_1 = .2$ $\phi_1 = 0$
$A_2 = .2$ $\phi_2 = 0$
$A_3 = .1$ $\phi_3 = 0$
$A_4 = 1$ $\phi_4 = 0$ FIG. 3
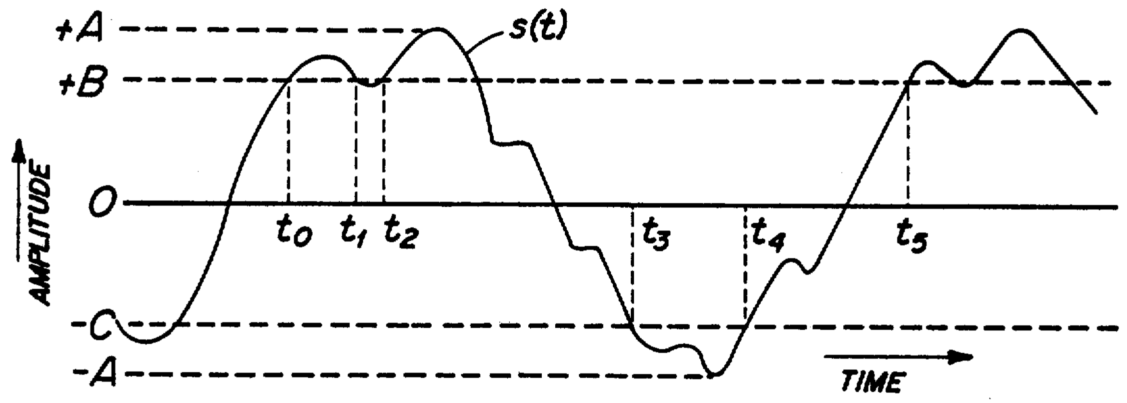
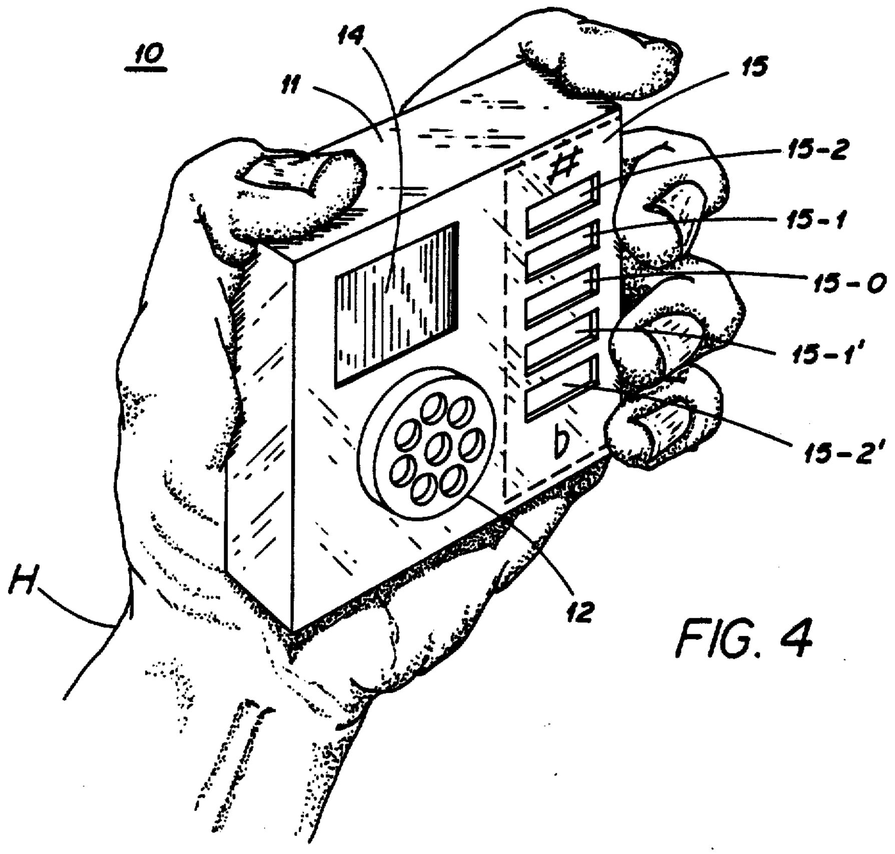
FIG. 4

DETERMINATION OF PITCH

This is a continuation-in-part of Ser. No. 816,740, filed July 18, 1977, now abandoned.

BACKGROUND OF THE INVENTION

The invention relates to the determination of the pitch of a wave, and, more particularly, to the accurate determination and indication of pitch using a compact, portable instrument, hereafter sometimes referred to as a pitch meter.

It is important to determine the pitch of a sound in order to tune musical instruments in general, and particularly stringed instruments such as pianos, violins and guitars. It is also important to determine pitch as an aid in the teaching of music and musical skills and in the evaluation of musical performance. A particular pitch is determined by the frequency or number of vibrations per second of the fundamental of a musical tone. A pitch can also be specified by its period which is the reciprocal of its fundamental frequency.

The measuring devices which are presently available for the accurate determination of pitch tend to be complex and cumbersome. Those which are simple and easy to use tend to be inaccurate. Thus, although tuning forks can be used to establish the pitch of a note, their use involves a cumbersome trial and error procedure and human judgment. In addition, there is no clear indication of the extent of the deviation between the fundamental frequency of a fork and that of a tone under consideration.

Accordingly, it is an object of the invention to make an evaluation of pitch with a high degree of accuracy and without resort to complex and cumbersome techniques or to techniques that require human judgment. A related object is to realize a portable meter and simple technique for the determination of musical pitch.

Another object of the invention is to realize in a simple and accurate way an indication of the extent of the departure of the fundamental pitch of a received tone from the pitch of the closest tone in a given list of standard tones.

Another object of the invention is to allow the user the option of adjusting over a narrow range the frequencies associated with standard tone names. For example, the standard tone associated with the name A can be adjusted over the range 430 to 450 Hz.

A further object of the invention is to determine the fundamental frequency of an incoming acoustic wave without interference and spurious indication because of the presence of harmonics.

Still other objects are to achieve wide range, fast acting pitch detection and display without the need for pre-adjustment, or of prespecification of a note or note range, or of calibration of the detector or of other human intervention in the measuring process. This allows the successive determination and display of the pitches of tones presented in sequence as in a performed musical passage.

THEORY OF PITCH DETERMINATION

To understand fully the various aspects of the invention and how it differs advantageously from previous techniques and devices proposed for the determination of pitch, it is necessary to consider certain matters relating to musical tones.

A sound is a variation with time of the pressure of air or other medium in which the sound is present. The variation of pressure (p) with time can be described in standard mathematical symbolism by a function of time, f(t), as shown in equation (1) below.

$$p=f(t) \qquad (1)$$

In musical sounds, according to Ohm's Law of Music, the function f(t) is periodic. That is, there is a number T such that for all values of t, $f(t+T)=f(t)$. The Period of the sound is the smallest value T for which this is true. The Fundamental Frequency of the sound is the number $f=1/T$.

The fundamental frequency of a musical sound will also be referred to as the Pitch of the sound, for it is true for the sounds produced by all musical instruments of common usage and by the human voice singing, that the subjective quality called pitch is determined by the fundamental frequency. The subjective quality called Timbre is determined by the detailed shape of the sound pressure wave f(t).

It is known that any periodic function with period T can be written as the sum of a constant and certain elementary functions, called sinusoids, that have periods T, T/2, T/3, T/4, etc., or, stated otherwise, that have fundamental frequencies $f_0=1/T$, $2f_0$, $3f_0$, $4F_0$, etc. Thus the wave-form of a musical sound can be written as in equation (2) below:

$$f(t)=C+A_1\cos(2\pi 1f_0t+\phi_1)+A_2\cos(2\pi 2f_0t+\phi_2)+A_3\cos(2\pi 3f_0t+\phi_3)+\ldots \qquad (2)$$

where term $A_1\cos(2\pi f_0t+\phi_1)$ is the fundamental of the sound;

term $A_2\cos(2\pi 2f_0t+\phi_2)$ is the second harmonic;

term $A_3\cos(2\pi 3f_0t+\phi_3)$ is the third harmonic; etc.

$A_n$ is called the amplitude of the general term $A_n\cos(2\pi nf_0t+\phi_n)$ and $\phi_n$ is the phase The foregoing matters are briefly illustrated by preliminary FIGS. 1 and 2.

BRIEF DESCRIPTION OF THE PRELIMINARY DRAWINGS

EXPLANATION OF THE PRELIMINARY DRAWINGS

Figure 1A:
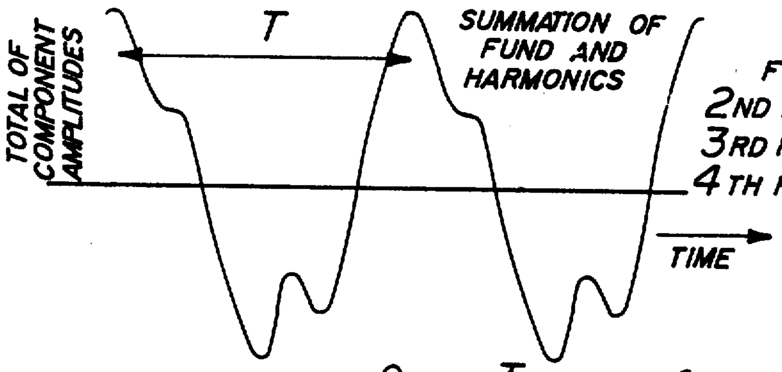
FIGS. 1A through 1D are waveforms composed of various harmonics.
Figure 1B:
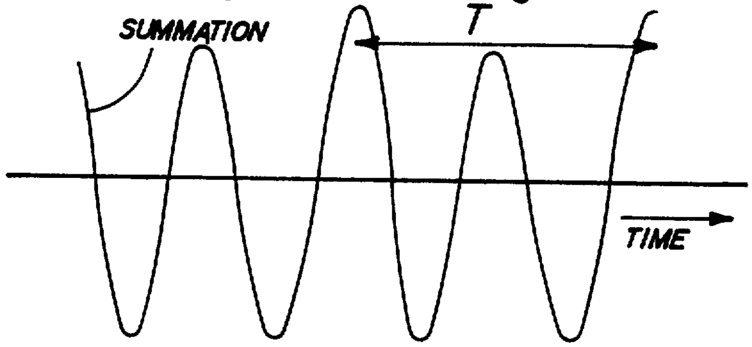
Figure 1C:
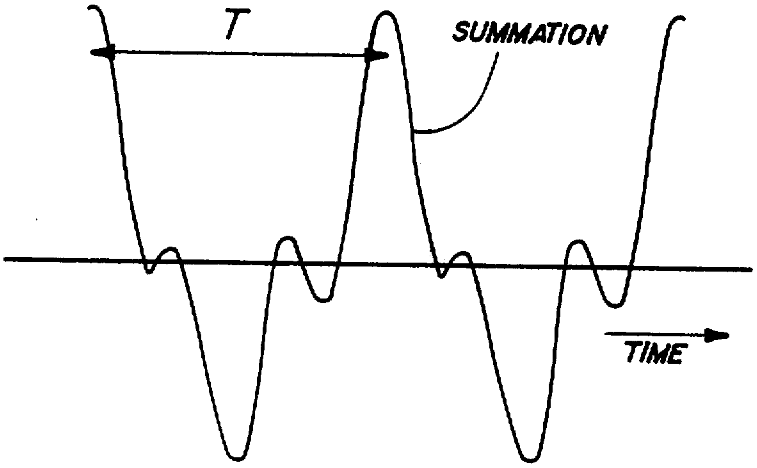
Figure 1D:
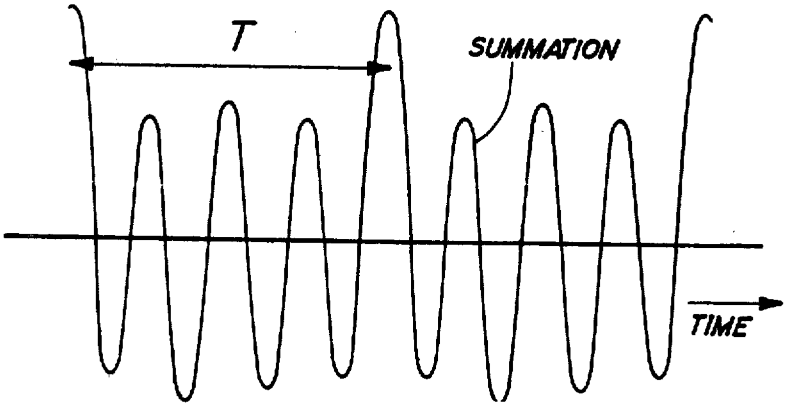
Figure 2A:
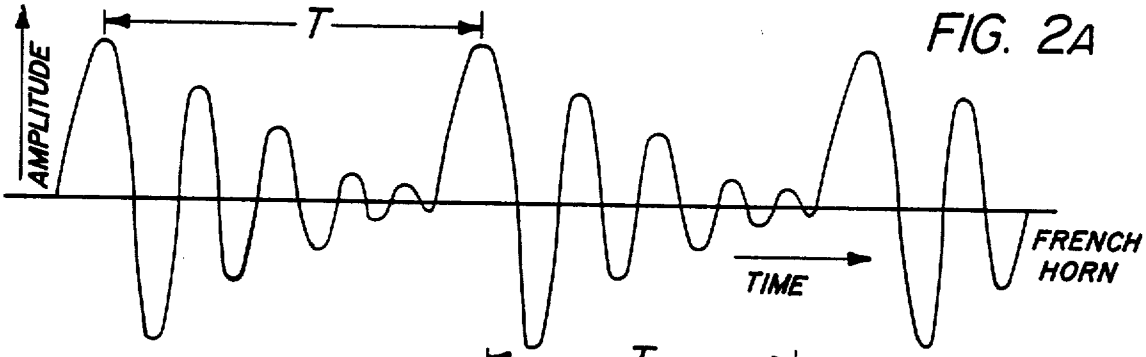
FIGS. 2A through 2D are waveforms for sustained tones produced by various instruments.
Figure 2B:
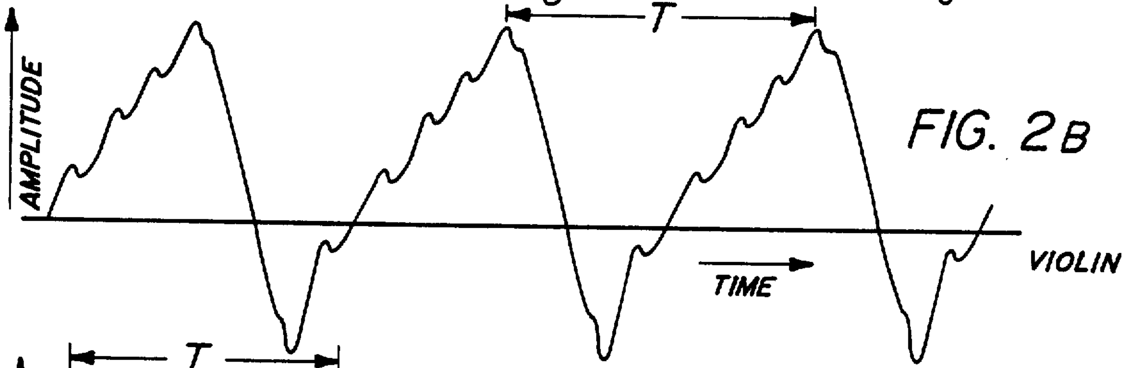
Figure 2C:
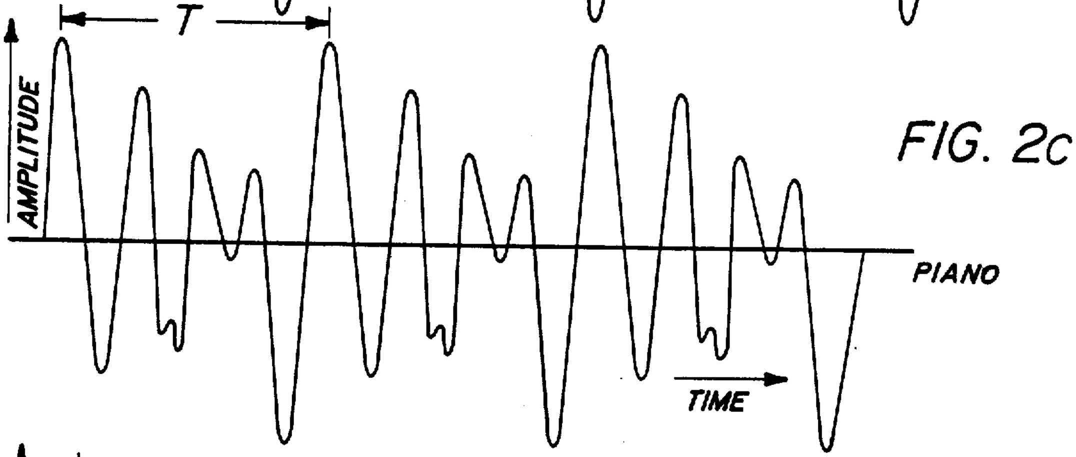
Figure 2D:
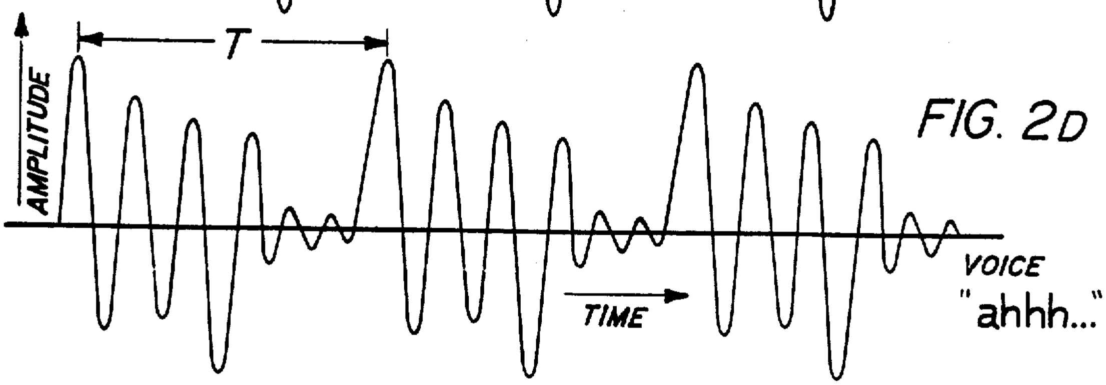

FIGS. 1A through 1D show several waveforms of the same period, each composed of a fundamental, or first harmonic, as well as second, third and fourth harmonics. The amplitudes $A_1$ through $A_4$ and phases $\phi_1$ through $\phi_4$ of the constituent sinusoids differ in each waveform. It is seen that the resultant wave-shape depends markedly on the phases and relative sizes of the amplitudes of the harmonics present.

FIGS. 2A through 2D show sound pressure waves of sustained tones produced by several different instruments and by the human voice. In each case the period T of the sound is indicated. In the violin wave of FIG. 2B, the amplitude of the fundamental is much larger than the amplitudes of any of the higher harmonics and the waveform resembles a slightly perturbed version of the fundamental having many small local jagged peaks. In the cases of the piano waveform of FIG. 2C and the singing voice waveform of FIG. 2D, a higher harmonic has much the largest amplitude and the resulting waveform seems to oscillate at the frequency of that strongest harmonic, but successive peaks follow a pattern whose period of repetition is the period of the waveform. Thus neither measuring the interval between successive zero-crosings of the waveform nor measuring the interval between successive peaks will yield a correct determination of the period of the sound in all cases.

DESCRIPTION OF THE PRIOR ART

Various machines that indicate the period of a repetitive waveform have been proposed in the past. Many of these employ banks of filters which are very expensive and which can only indicate whether the waveform has one of a fixed set of periods. Such devices will give an erroneous indication of the fundamental frequency of a wave such as that of the piano (of FIG. 2C) that possess a higher harmonic with amplitude much larger than the amplitude of the fundamental.

Other machines that work directly in the time domain with measurements made on the waveform either fail to work universally for all conventional musical instruments or else require previous knowledge of the approximate period of the waveform to be measured. Thus the threshold scheme of Dimotakis et al., U.S. Pat. No. 4,051,433, Sept. 27, 1977 will ascribe to the piano waveform of FIG. 2 a pitch equal to the frequency of the dominant harmonic. That is, it will estimate the period of this waveform to be twice the interval between successive zero crossings. This is evident on referring to FIG. 8 of the patent.

The methods proposed by Merritt in U.S. Pat. No. 4,028,985 and by Zurcher in British Pat. No. 1,445,855 August 1976 circumvent this difficulty by measuring the intervals between the occurrence of certain peaks in the waveform and by rejecting some of these intervals if they do not lie within prescribed bounds. But these bounds must be set from an a priori approximate knowledge of the pitch of the waveform being measured. The devices cannot successfully indicate the pitch of a succession of incident notes of greatly varying fundamental frequencies without human intervention to adjust the machine between notes. For example, if the machine of Merritt is successfully indicating the period of a sound and the incident sound is then changed to one having period ½ as great, the period-reject device designated 17 in FIG. 2 of the Merritt patent will reject all succeeding peaks and the device will cease to function.

In addition to requiring no a priori knowledge of the period to be measured, the pitch determination scheme of the invention permits physical realizations much simpler in structure and much less costly than those described elsewhere, as will be made evident in the ensuing detailed discussion.

SUMMARY OF THE INVENTION

In accomplishing the various objects heretofore set forth and related objects, the invention provides a method and apparatus for the determination of pitch by converting an acoustic wave under test into an electrical signal which is detected each time it exceeds a prescribed threshold level for the first time after having crossed a prescribed lower threshold level. The time interval required for a prescribed number of threshold level detections of this sort provides a measure of the fundamental period of the wave. Alternatively, the number of such threshold level detections in a fixed time interval provides a measure of the fundamental frequency of the tone.

In accordance with one aspect of the invention, the measure of pitch can be indicated directly or it can be compared with stored or generated measures of pitch for standard tones and the closest standard value indicated by name or other designation.

In accordance with a further aspect of the invention, an indication can be made of the extent of the departure of the pitch of the received tone from that of the closest standard tone.

In accordance with another aspect of the invention, prior to pitch measurement the signal can be passed through a non-linear device to increase the discrepancy in size between the various peaks in the signal wave.

In accordance with another aspect of the invention, the signal can be adjusted before its pitch is measured by being made to undulate between prescribed maximum and minimum levels. This can be accomplished by automatic gain controls and appropriate bias voltages derived from the incoming wave.

In accordance with yet another aspect of the invention, the threshold is a prescribed fraction of the maximum level, illustratively 0.9. The detection of a threshold crossing is accomplished by circuitry which is activated when the threshold is first exceeded and reactivated thereafter only after a crossing of a prescribed lower threshold level has occurred. Such circuitry advantageously includes a settable and resettable two-state device.

In accordance with yet another aspect of the invention, the pitches of the list of standard tones with which the incoming wave is compared can be altered in a simple manner by (a) either multiplying the determined period of the incoming wave by a constant factor prior to comparison with the stored standard periods, or (b) by changing the rate of the internal clock that is used in the measurement of the period of the incoming wave. This adjustment permits the optional setting of the scale of the pitch meter to any desired value near the standard scale prior to use.

DESCRIPTION OF THE PRINCIPAL DRAWINGS

Figure 5:
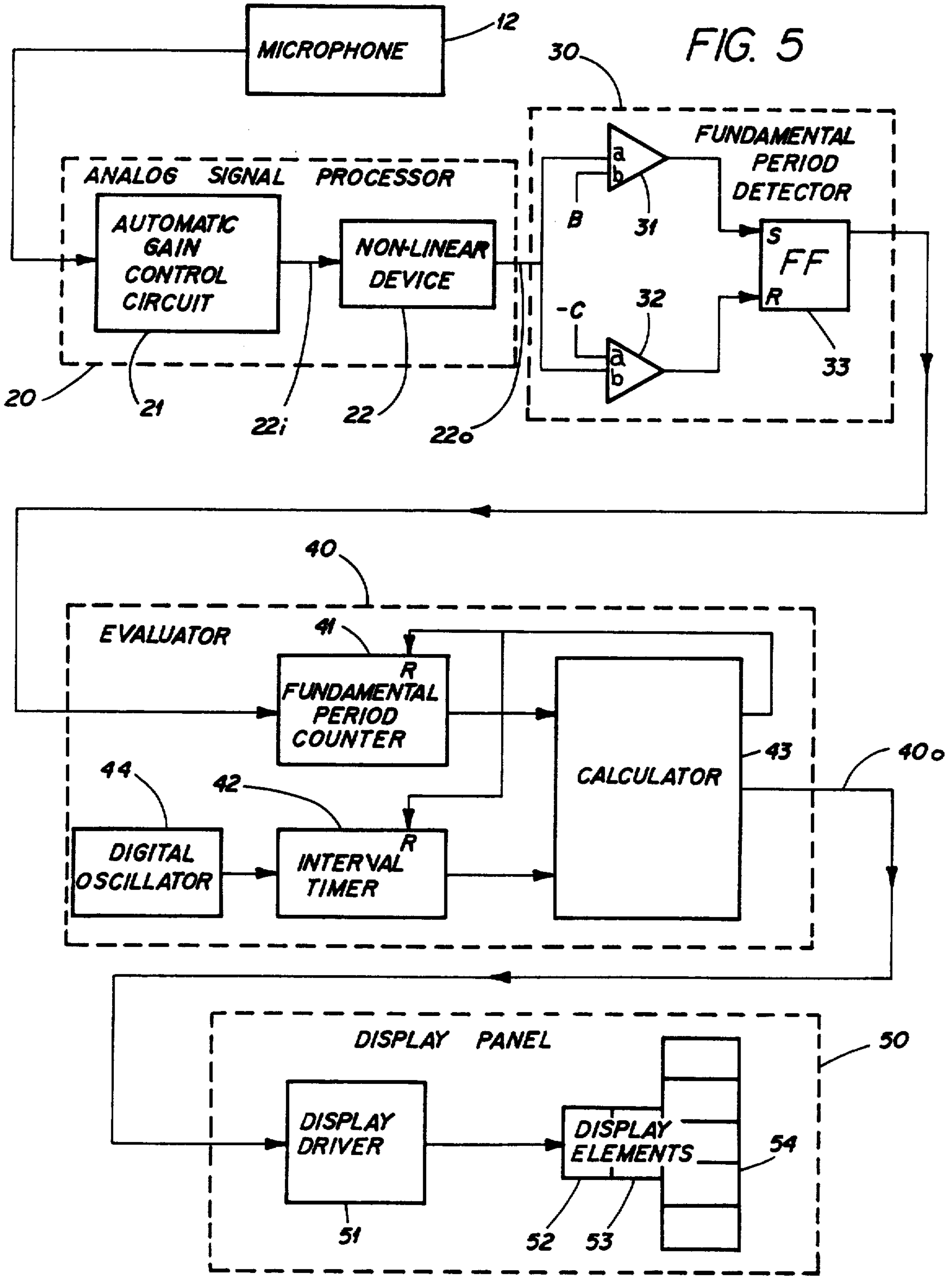
Figure 6:
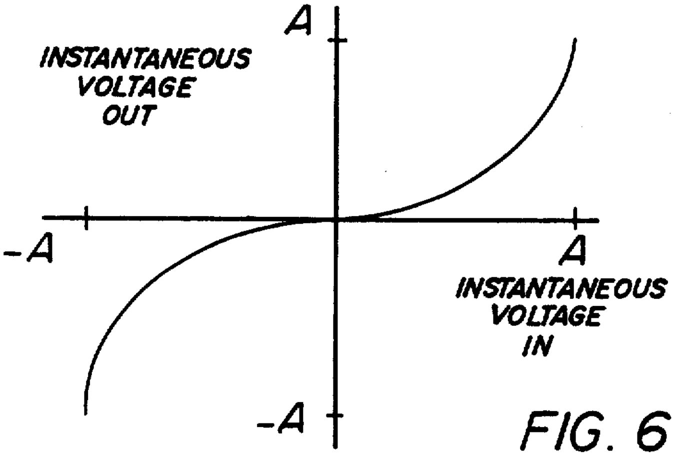
Figure 7:
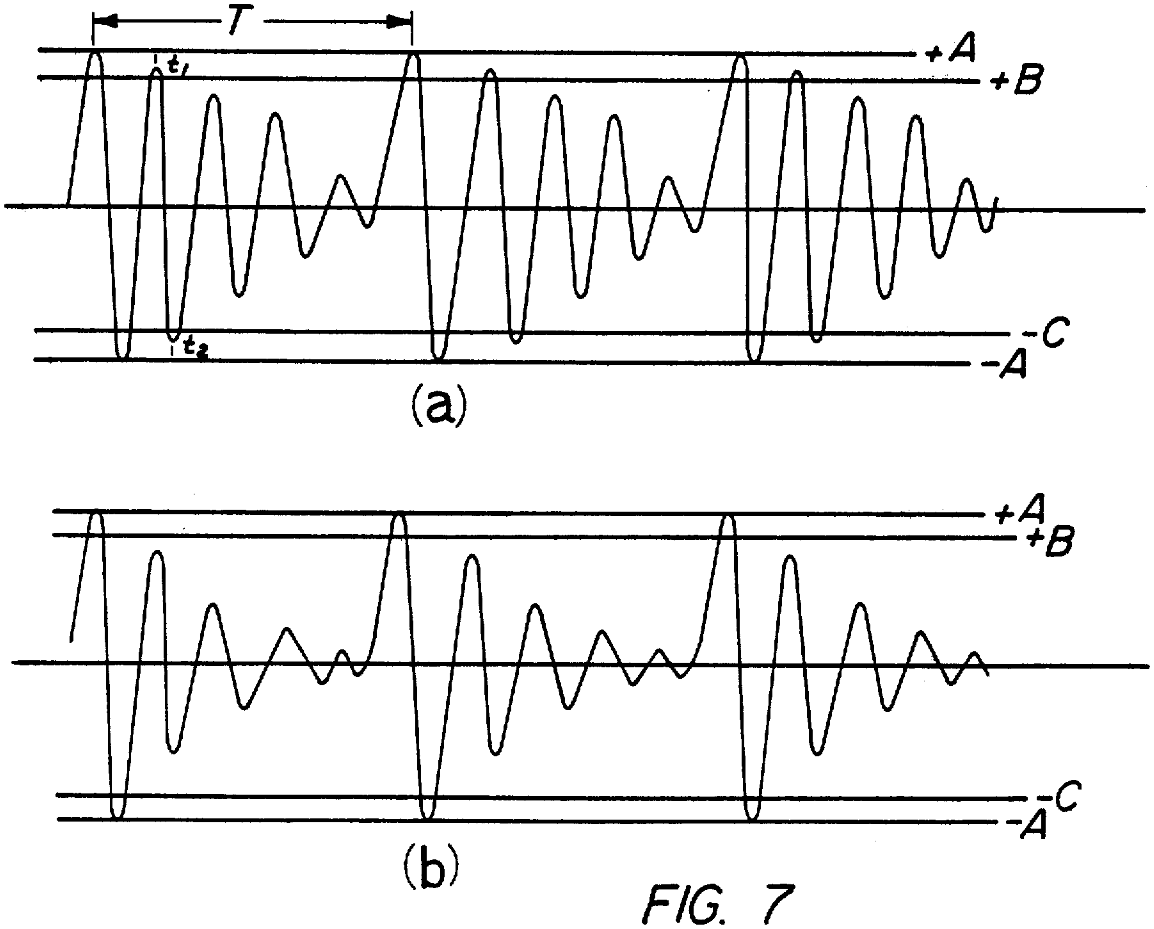

Other aspects of the invention will become apparent after considering several illustrative embodiments, taken in conjunction with the principal drawings in which:

FIG. 3 is a generalized waveform illustrating the invention;

FIG. 4 is a perspective view of a portable pitch meter in accordance with the invention;

FIG. 5 is a block and schematic diagram for the pitch meter of FIG. 4;

FIG. 6 is a sketch of the input-output characteristics of the Nonlinear Device of FIG. 5;

FIG. 7 shows input and output waveforms which illustrate the function of the nonlinear device of FIG. 5.

It is to be noted that FIGS. 1 and 2 are described under the Description of the Preliminary Drawings.

DETAILED DESCRIPTION

Turning to the drawings, FIG. 3 illustrates a key feature of the invention which provides a universal method for determining the period of varied waveforms, that is, for determining the shortest interval of time after which the entire pattern repeats itself. The method requires no previous knowledge of the approximate range of the period.

First, in implementing the invention, the vertical scale and zero level are chosen so that the waveform oscillates precisely between two chosen levels, for example plus A and minus A. This is illustrated in the typical musical instrument waveform of FIG. 3. Next, two thresholds, B and C are selected as indicated. A clock is started at the instant $t_0$ when the waveform first crosses upwardly through level B. The clock is stopped at the next up-crossing of level B that occurs after a down-crossing of level C. In the illustration the first down-crossing of level C occurs at time $t_3$ and the clock is stopped at time $t_5$ which is the moment of the first up-crossing of level B that occurs after time $t_3$. The clock reading at time $t_5$ is the period of the wave.

Referring to FIG. 2, it will be seen that the method of the invention will correctly give the period of each of the wavewaveforms shown there provided that the threshold level B is close to level A and that the level C is close to level −A. This latter set of conditions is needed for waveforms such as those of the voice or piano shown in FIG. 2 in which a higher harmonic dominates. The condition that level C must be crossed before an up-crossing of B can stop the clock prevents small amounts of higher harmonics from giving spurious pitch indications. For example, in FIG. 3 this prevents stopping the clock at $t_2$. The interval $t_2$–$t_0$ would measure the period of a higher harmonic of this waveform and not that of its fundamental.

The foregoing is implemented in FIG. 4 which shows a portable pitch meter 10 in accordance with the invention being held in a hand H of a user. The meter 10 is formed by a housing 11 with an embedded microphone 12 connected to internal circuitry for operating display panels 14 and 15.

The display panel 14 is for registering an appropriate one of the 12 notes of a musical octave: C, C-sharp, D, D-sharp, E, F, F-sharp, G, G-sharp, A, A-sharp and B. It will be understood that in the equal-tempered scale a sharp of one note is the same as a flat of the next higher note; thus C-sharp is equivalent to D-flat.

Adjoining the panel 14 is a further panel 15 with five windows 15-0, 15-1 and 15-1', and 15-2 and 15-2'. A mid-window 15-0 is illuminated when the pitch of an incident not is determined to be within a certain small range of frequencies centered on that of a standard tone. If the frequency of the incident tone departs sufficiently from that of the standard tone, one of the adjacent windows 15-1 and 15-2, or 15-1' and 15-2' will be illuminated according to the magnitude and direction of the departure.

Thus the microphone 12 of the portable pitch meter 10 receives an incident tone and internal circuitry is operated so that the display panel 14 indicates the name (e.g., D#) of the note closest to it in frequency among a set of standard tones, and panel 15 indicates the extent and direction of the departure in frequency of the incident tone from the indicated standard note. If the frequency of the incident tone is nearly identical to that of the displayed note, the mid-window 15-0 will be illuminated. However, if the incident tone is slightly higher in frequency, or sharper, than the displayed note, one of the windows 15-1 or 15-2 will be illuminated according to the extent of the sharpness. Conversely, if the incident note is lower in frequency, or flatter, than the displayed note, one of the windows 15-1' or 15-2' will be illuminated according to the extent of flatness. Clearly, larger departures from the standard frequencies are indicated by the window further from the center window. The display can be color-coded for ease in interpretation so that, for example, the illumination of window 15-0 is green, that of 15-1 and 15-1' is yellow, and that of 15-2 and 15-2' is red. A wide variety of other forms of display can be used also.

Representative circuitry for controlling the display panels 14 and 15 is set forth in FIG. 5. An incoming tone that is received by the microphone 12 is applied to an analog signal processor 20, processed by a fundamental period detector 30, passed to an evaluator 40, and the evaluation is used to control the display panel 50.

The microphone 12 converts an acoustic musical tone to an electrical signal and feeds it to the analog signal processor 20. The signal is applied to an automatic gain control device 21 of standard design which performs three functions:

(a) it adjusts the DC level of the signal so as to make the maximum positive and negative excursions of the signal equal;

(b) if the average power in the incident signal exceeds some pre-specified threshold value, it increases the amplitude of the maximum positive and negative excursions of the signal to +A and − A, respectively. It will be understood that the threshold value and the peak value A are a matter of choice in accordance with the particular circuit components that have been selected;

(c) if the average power in the incident signal is less than the threshold value, it "squelches" the signal. That is, it outputs a steady signal with amplitude 0.

FIG. 7*a* shows a typical output signal of the automatic gain control device for the case in which the average power exceeds the threshold value.

The gain-adjusted signal is now passed to the nonlinear device 22 whose input-output characteristics are shown in FIG. 6. Basically this device selectively decreases the amplitude of the signal, attenuating small signal amplitudes proportionately more than large values. The effect of this selective attenuation is to magnify the relative differences between signal levels near the maximum value A. This permits the invention to successfully determine the pitch of a wider variety of signals—particularly those in which the energy of the fundamental is significantly less than that in certain higher harmonics.

FIG. 7 illustrates one such waveform. FIG. 7*a* shows the waveform at point 22*i* in FIG. 5; FIG. 7*b* shows the resulting waveform at the output of the nonlinear device 22. The absolute delay introduced by the nonlinear device is small and, since it has no effect on the operation of the pitch meter, is ignored here. In FIG. 7*a* the energy if the fifth harmonic is substantially greater than that in the fundamental. Without the nonlinear device the peak at time $t_1$ could pierce the upper threshold A and at time $t_2$ could pierce the lower threshold −A. This would cause any procedure which counts threshold piercings to produce an erroneous estimate of pitch. The nonlinear device 22 causes the amplitudes of all peaks which are less than the threshold A to be reduced. Thus the output of the device, shown in FIG. 7*b*, will not register the spurious threshold piercings.

The modified wave $s_o(t)$ which appears at 22*o* on FIG. 5 is applied to a fundamental period detector 30 which is specially constructed to respond at the time the wave first crosses a prescribed threshold level B after having passed through a lower level crossing C as explained below. The threshold is given by equation (3).

$$B=kA \quad (3)$$

where

B is the threshold level;

k is a constant multiplier less than 1; and

A is the peak amplitude of the modified wave $s_o(t)$.

A suitable constant multiplier k has been empirically determined to be 0.9.

A crossing by the signal of the lower level C followed by the first succeeding crossing by the signal of level B is called a proper double crossing. The proper double crossing is said to occur at the instant that the signal first crosses the level B after having crossed level C. The function of the fundamental period detector 30 of FIG. 5 is to detect proper double crossings.

An illustrative fundamental period detector is shown in FIG. 5. It will be understood that the threshold detector may take a wide variety of other forms. The modified signal $s_o(t)$ is applied as a voltage waveform at an input terminal 22*o*. The voltage comparators 31 and 32 shown are standard electronic components. When the voltage on the a input of a comparator equals or exceeds that on the b input, the output is a logic 1; if the voltage on the b input exceeds that on the a input, the comparator output is logic 0. Thus for the arrangement shown in FIG. 5, when the voltage on the input terminal 22*o* equals or exceeds B volts, the comparator 31 produces a logic 1 at its output while the comparator 32 produces a logic 0. When the input voltage at 22*o* lies between B and C volts both comparators produce logic 0's at their outputs. Finally, when the input 22*o* is less than or equal to C volts, 31 produces logic 0 but 32 produces logic 1.

The net effect then of a proper double crossing is to cause the flip-flop 33 to reset as the input voltage passes down through the value C and then to set at the moment that the next up crossing of the level B occurs. The Fundamental Period Counter 41 is constructed to count by one only at the instant each proper double crossing occurs. Since the flip-flop remains in its last state when both the S and R inputs are at logic 0, no count is registered by the Fundamental Period Counter until after the voltage on input 22*o* has again dropped below the value C causing the flip-flop to reset. Thus, for example, if the voltage wave shown in FIG. 3 is applied to the input 22*o* to the fundamental period detector, the count on the Fundamental Period Counter increases by one at instances $t_0$ and $t_5$ but no count is registered at the crossings $t_1$, $t_2$, $t_3$, or $t_4$.

The value of the nonlinear device 22 should now be evident. For waveforms such as that of FIG. 7*a* in which the energy of the fundamental is considerably less than that of a higher harmonic, it greatly enhances the ability of the invention to detect proper double crossings at the fundamental frequency while rejecting double crossings caused by higher harmonics.

After the pitch detector has calculated and displayed a pitch, or alternatively immediately after power is applied to the unit, the value stored in the fundamental period counter 41 is set to 0 by a signal applied to its R-input by the calculator. The value of elapsed time stored in the interval timer 42 is similarly set to 0. the first proper double crossing causes the fundamental period counter to increment to 1 and this in turn causes the interval timer to begin counting.

The interval timer consists of a counter whose input is a digital pulse train produced by the digital oscillator 44. This oscillator operates at a frequency which is much higher than the highest musical tone of interest, for example it can oscillate at 10 kHZ. The accuracy with which this oscillator operates is important; normal crystal oscillator accuracy of 1 part in $10^5$ is sufficient, however.

The outputs of both the fundamental period counter 41 and the interval timer 42 are fed to the calculator 43 which uses this information to determine the pitch and to produce the signals 40*o* necessary to control the display panel 50.

There are basically two ways in which the calculator can determine pitch. It can determine the time required for N periods of the fundamental of the incident sound or it can determine the number of periods which occur in a given time interval. Both methods have particular advantages, depending on the implementation details. However in the subsequent description we will consider only the former method, as it yields greater accuracy with a shorter measurement interval.

In practice N=20 appears to be a workable value. Thus with an incident fundamental frequency of 1 kHZ and an oscillator frequency of 10 kHZ, 0.020 seconds will be required for 20 periods. In this time the interval timer will count to 200.

The calculator 43 uses the number of counts fed to it by the timer to determine the display information 40*o*. There are many ways in which this can be done. The most straightforward method conceptually is to calculate the frequency from equation (4).

$$f_{average}=(\text{Number of fundamental periods elapsed time}) \quad (4)$$

Then this frequency can be compared to a set of standard tones and the closest one determined. The magnitude of the difference between the frequency of the incident tone and that of the nearest standard note can be found by simple subtraction.

With a modern computing element the above method is workable. However, the following technique offers advantages of implementation simplicity and is the one used in the current embodiment.

The range of the instrument can be made as large as desired. However, since most musical tones lie in the range from 32 to 4095 Hz, this range is used illustratively in the following description.

The elapsed time for N (e.g., 20) fundamental periods can vary over a wide range. For the lowest tone of interest (i.e., 32 HZ), the count in the interval timer will be 6250. For the highest note (i.e., 4096 HZ) it will be 49. Since there is no interest in knowing or displaying the octave in which the incident tone lies, all time intervals are first normalized by successively multiplying them by 2 until a number is reached which lies in the range, say between 4096 and 8191. Then the resulting number, when expressed in binary form, consists of 13 binary digits of which the leftmost is always a 1. The other 12 binary digits can now be used to address a $2^{12}=4096$—word read-only-memory. Each 7-bit word in this memory contains the information necessary to control the three display elements 52, 53, and 54. The word is fed to the display driver 51 which uses it to apply the proper voltages and currents to the display elements 52, 53, and 54. The word is used as follows:

bits 1, 2, 3, 4 select note name [A, A#, B, C, C#, D, D#, E, F, F#, G, G#]

bits 5, 6, 7 select offset indicator [very sharp, sharp, right on, flat, very flat]

An octave in music corresponds to a change in frequency of a factor of 2. Thus if a waveform of the type shown in FIG. 7*a* should have two peaks of almost identical amplitude in each fundamental period, (i.e., be so close together in amplitude that the nonlinear device 22 could not significantly affect the difference between them) then the fundamental period counter would actually be counting at twice the proper frequency. However, the calculated note and displayed symbol would be correct nevertheless, because the invention is not concerned with the octave in which the note lies. A musician generally knows the octave in which his note lies and does not need this information displayed.

Not shown in FIG. 5, but a necessary part of the pitch meter, is a power supply and an on-off switch. The power supply can be a battery or rechargeable battery pack, or the pitch meter can be constructed to receive its energy from a conventional 110-volt A.C. source.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. The method of determining the pitch of a periodic musical tone which comprises the steps of:

(1) converting the periodic wave of the tone into an electrical signal;

(2) detecting each first excursion of said signal above a prescribed positive threshold after a lower level negative crossing;

(3) determining a measure of the pitch period of the signal by measuring the time interval between a prescribed number of such excursions indenpendently of the axis crossings of the signal between successive detections; and (4) using the period thus determined to provide an indication of the pitch of said periodic wave.

2. The method of claim 1 wherein the amplitude of said signal is adjusted before being detected.

3. The method of claim 2 wherein said signal is adjusted to undulate between a prescribed maximum level and a prescribed minimum level.

4. The method of claim 3 wherein said signal is adjusted so that the maximum and minimum levels are symmetrically placed about the zero level.

5. The method of claim 2 wherein the descrepancies between large and small excursions of the signal are increased by passage of the signal through a nonlinear device.

6. The method of claim 1 wherein said lower level crossing is at a negative threshold.

7. The method of claim 1 wherein said threshold is a prescribed fraction of said maximum level.

8. The method of claim 1 wherein the detection is accomplished by circuitry which is actuated when said prescribed threshold is first exceeded and is reactivated thereafter only after a lower level crossing has occurred.

9. The method of claim 8 wherein said circuitry includes a settable and resettable two-state device.

10. The method of claim 1 wherein the measure of said period is compared with stored or generated measures of periods for standard signals and the indication is of the standard measure closest to the determined measure.

11. The method of claim 10 wherein there is an indication of the extent of the departure of the pitch of said acoustic wave from the pitch of the closest standard signal.

12. The method of claim 10 wherein the indication of the standard measures are the names of the notes in the musical scale within one octave.

13. The method of claim 12 wherein the indication is achieved by successively multiplying the measured period by 2 until the period lies in a prescribed interval.

14. The method of claim 1 wherein the time interval is measured by counting the number of pulses emitted by a high frequency oscillator during the interval between the prescribed number of excursions.

15. The method of claim 1 wherein the standard measure is shifted by multiplying the measured interval by a constant before comparing with the standard measures.

16. The method of claim 1 wherein the standard measure is shifted by changing the frequency of the oscillator used to generate timing pulses.

17. The method of claim 1 further including the step of adjusting the elctrical signal to change disproportionately the amplitudes of successive peak excursions.

* * * * *